United States Patent
Suh et al.

(10) Patent No.: US 6,778,105 B2
(45) Date of Patent: Aug. 17, 2004

(54) METHOD OF MODULATING SERIES OF DATA WORDS INTO CONSTRAINED SEQUENCE

(75) Inventors: Sang Woon Suh, Seoul (KR); Jin Yong Kim, Kyunggi-do (KR); Jae Jin Lee, Seoul (KR); Joo Hyun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/363,537

(22) PCT Filed: Jul. 3, 2002

(86) PCT No.: PCT/KR02/01255

§ 371 (c)(1),
(2), (4) Date: Apr. 2, 2003

(87) PCT Pub. No.: WO03/005589

PCT Pub. Date: Jan. 16, 2003

(65) Prior Publication Data

US 2003/0169191 A1 Sep. 11, 2003

(30) Foreign Application Priority Data

Jul. 5, 2001 (KR) ........................ 2001-40155

(51) Int. Cl.⁷ .............................. H03M 7/00
(52) U.S. Cl. ................ 341/59; 341/58; 341/51; 341/94
(58) Field of Search ........................ 341/59, 58, 51, 341/94, 50, 68

(56) References Cited

U.S. PATENT DOCUMENTS

| 5,198,813 | A | | 3/1993 | Isozaki |
| 5,790,056 | A | * | 8/1998 | Schouhamer Immink .... 341/59 |
| 6,079,041 | A | * | 6/2000 | Kunisa et al. ............... 714/752 |
| 6,177,890 | B1 | * | 1/2001 | Keirn et al. .................. 341/59 |
| 6,606,038 | B2 | * | 8/2003 | Immink et al. ............... 341/59 |

FOREIGN PATENT DOCUMENTS

JP          7-245565 A2     9/1995

* cited by examiner

*Primary Examiner*—Michael Tokar
*Assistant Examiner*—Lam T. Mai
(74) *Attorney, Agent, or Firm*—Birch, Stewart, Kolasch & Birch, LLP

(57) ABSTRACT

A method and apparatus of converting a series of data words into modulated signals generates for each data word, a number of intermediate sequences by combining mutually different digital words with that data word, scrambles the intermediate sequences to form alternative sequences, translates each alternative sequence into a (d,k) constrained sequence, measures for each (d,k) constrained sequence, not only an inclusion rate of undesired sub-sequence but also a running DSV (Digital Sum Value), and selects one (d,k) constrained sequence having small inclusion rate for recording on an optical or magneto-optical recording medium among the (d,k) constrained sequences having maximum value of running DSV. smaller than a preset limit. Accordingly, efficient DSV control can be achieved for even relatively-long sequences.

17 Claims, 4 Drawing Sheets

METHOD OF MODULATING SERIES OF DATA WORDS INTO CONSTRAINED SEQUENCE

This application is the national phase under 35 U.S.C. § 371 of PCT International Application No. PCT/KR02/01255 which has an International filing date of Jul. 3, 2002, which designated the United States of America, which claims priority based on Korean Application No. 01-40155 filed Jul. 5, 2001.

TECHNICAL FIELD

The present invention relates to method of modulating a series of data words into (d,k) constrained sequence with good suppression of a direct current (DC) component.

BACKGROUND ART

When data is transmitted through a transmission line or recorded onto a recording medium such as a magnetic disk, an optical disk or a magneto-optical disk, the data is modulated into code matching the transmission line or the recording medium prior to the transmission or recording.

Run length limited codes, generically designated as (d,k) codes, have been widely and successfully applied in modern magnetic and optical recording systems. Such codes, and means for implementing said codes, are described by K. A. Schouhamer Immink in the book entitled "Codes for Mass Data Storage Systems" (ISBN 90-74249-23-X, 1999).

Run length limited codes are extensions of earlier non return to zero recording (NRZ) codes, where binarily recorded "zeros" are represented by no (magnetic flux) change in the recording medium, while binary "ones" are represented by transitions from one direction of recorded flux to the opposite direction.

In a (d,k) code, the above recording rules are maintained with the additional constraints that at least d "zeros" are recorded between successive data "ones", and no more than k "zeros" are recorded between successive data "ones". The first constraint arises to obviate intersymbol interference occurring due to pulse crowding of the reproduced transitions when a series of "ones" are contiguously recorded. The second constraint arises in recovering a clock from the reproduced data by "locking" a phase locked loop to the reproduced transitions. If there is too long an unbroken string of contiguous "zeros" with no interspersed "ones", the clock regenerating phase-locked-loop will fall out of synchronism.

In, for example, a (2,7) code there is at least two "zeros" between recorded "ones", and there are no more than seven recorded contiguous "zeros" between recorded "ones". The series of encoded bits is converted, via a modulo-2 integration operation, to a corresponding modulated signal formed by bit cells having a high or low signal value, a 'one' bit being represented in the modulated signal by a change from a high to a low signal value or vice versa. A 'zero' bit is represented by the lack of change of the modulated signal.

As described above, when data is transmitted through a transmission line or recorded onto a medium, the data is modulated into a coded sequence matching the transmission line or recording medium prior to the transmission or recording. If the coded sequence resulting from the modulation contains a direct current (DC) component, a variety of error signals such as tracking errors generated in control of a servo of the disk drive become prone to variations or jitter are generated easily.

The first reason for using said dc-free signals is that recording channels are not normally responsive to low-frequency components. The suppression of low-frequency components in the signal is also highly advantageous when the signal is read from an optical record carrier on which the signal is recorded in the track, because then continuous tracking control undisturbed by the recorded signal is possible.

A good suppression of the low-frequency components leads to improved tracking with less disturbing audible noise. For this reason it is thus desirable to make as many efforts to prevent the modulated sequence from containing a direct current component as possible.

In order to prevent the modulated sequence from containing a direct current component, control of a DSV (Digital Sum Value) to prevent the modulated signal from containing a direct current component has been proposed. The DSV is a total found by adding up the values of a train of bits, wherein the values +1 and −1 are assigned to '1' and '0' in the train respectively, which results after NRZI modulation of a train of channel bits. The DSV is an indicator of a direct current component contained in a train of sequences.

A substantially constant running digital sum value (DSV) means that the frequency spectrum of the signal does not comprise frequency components in the low frequency area. Note that DSV control is normally not applied to a sequence generated by a standard (d,k) code. DSV control for such standard (d,k) codes is accomplished by calculating a DSV of a train of encoded bits after the modulation for a predetermined period of time and inserting a predetermined number of DSV control bits into the train of encoded bits. In order to improve the code efficiency it is desirable to reduce the number of DSV control bits to a smallest possible value.

An example of the use of modulated signals to record and read an audio signal on an optical or magneto-optical record carrier can be found in U.S. Pat. No. 4,501,000. The specification describes the Eight-to-Fourteen (EFM) modulation system, which is used for recording information on Compact Disks (CD) or MiniDisk (MD). The EFM-modulated signal is obtained by converting a series of 8-bit information words into a series of 14-bit code words, and where 3-bit merging words are inserted between consecutive code words.

Respective code words of 14 bits satisfy the conditions that at least d=2 and at most k=10 "0"s are placed between two "1"s. In order to satisfy this condition also between code words, 3-bit merging words are used. Four 3-bit merging words of 8 possible 3-bit merging words are permitted to be used, namely "001", "010", "000", and "100". The remaining possible 3-bit merging words, namely "111", "011", "101", and "110" are not used as they violate the prescribed d=2 constraint.

One of the four allowed merging words is selected such that the bit string obtained after cascading alternate code words and merging words satisfies the (d,k)-constraint, and that in the corresponding modulo-2 integrated signal the DSV remains substantially constant. By deciding the merging words according to above rules, low-frequency components of the modulated signal can be reduced.

In the meantime, information recording still has a constant need for increasing the reading and writing speed. The aim of increased reading speed, however, requires higher servo bandwidth of the tracking mechanism, which, in turn, sets more severe restrictions on the suppression of the low-frequency components in the recorded signal.

Improved suppression of the low-frequency components is also advantageous for suppressing audible noise arising from the tracking mechanism. For this reason, it is desirable to make as many efforts to prevent the signal from containing low-frequency components.

DISCLOSURE OF INVENTION

It is an object of the present invention to provide a coding system which is able to generate for each data word a corresponding sequence, which can suppress dc-components precisely, and does not contain long string of '0's, and long runs of the smallest runlength d, under the rules of the (d,k) code for recording onto a recordable medium.

A method of converting a series of data word into a modulated signal according to the present invention generates for each data word a number of alternative sequences by combining mutually different digital words with the data word, translates each alternative sequence into a (d,k) constrained sequence according to a predefined coding rate m/n, detects development of digital sum every bit for each translated (d,k) constrained sequence and checks whether or not each development of digital sum is beyond a preset threshold, sorts out the translated (d,k) constrained sequences based on whether each development of digital sum is ever beyond the preset threshold, and selects one (d,k) constrained sequence, of which development of digital sum has the least maximum value, among the sorted-out sequences for recording onto a recordable medium or transmission through channel.

The above-characterized method of converting a series of data words into a modulated signal according to the present invention, makes it possible to suppress DC component of sequences precisely for recording onto a recordable medium such as an optical disk or a magneto-optical disk, while excluding sequences with a sync pattern, long string of '0's, and long runs of the smallest runlength d under the rules of the (d,k) code.

This invention can suppress DC component more remarkably in case that a sequence becomes longer.

MODES FOR CARRYING OUT THE INVENTION

In order that the invention may be fully understood, a preferred embodiment thereof will now be described with reference to the accompanying drawings.

Figure 1:
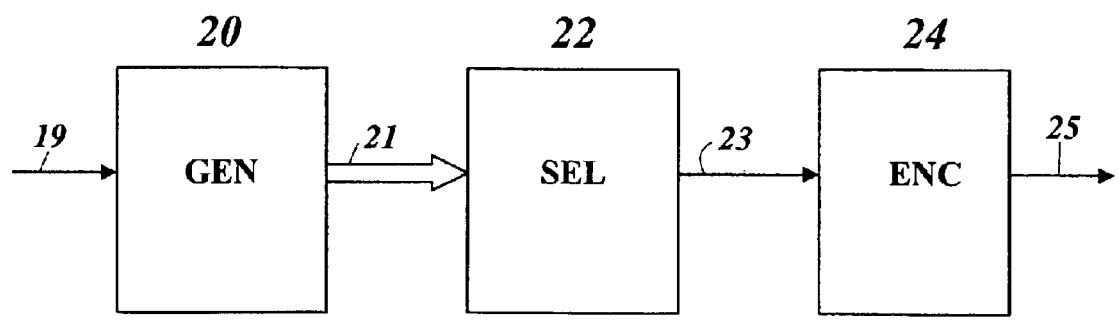
FIG. 1 shows a block diagram of an embodiment of an encoding system according to the invention.

FIG. 1 shows a block diagram of an embodiment of an encoding system according to the invention.

Using a generator 20, a selector 22, the encoding system translates user data 19 into a (d,k) constrained sequence 23, wherein a plurality of predefined subsequence are fully absent or occur with a small probability. The (d,k) constrained sequence, in turn, is translated, using a precoder 24, into a runlength-limited sequence 25 with suppressed low-frequency components.

Figure 2:
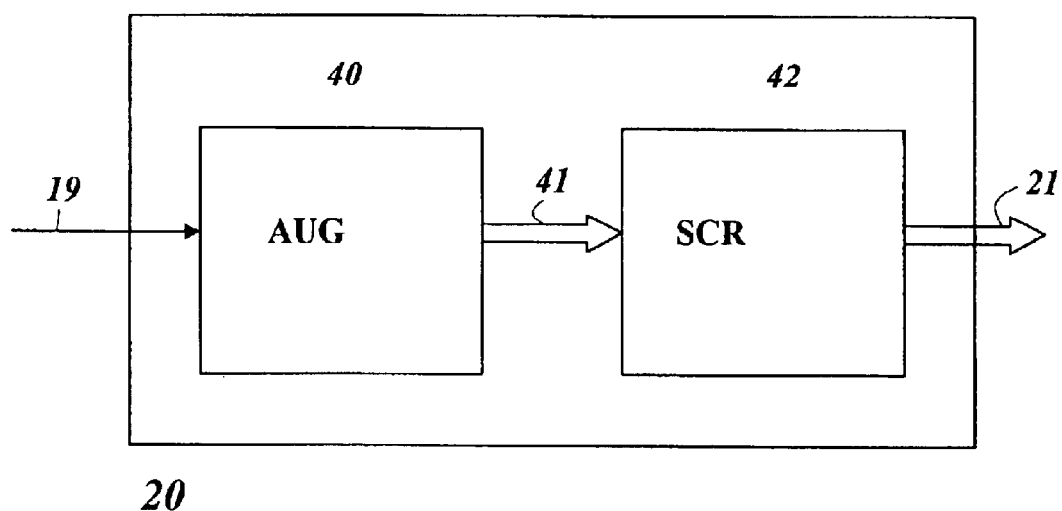
FIG. 2 shows an explanatory diagram of part of an embodiment of a coding scheme used for carrying out augmenting and scrambling of the digital words.

As shown in FIG. 1 the coding system comprises a generator 20, whose detailed block diagram is displayed in FIG. 2. The generator 20 comprises an augmentor 40 that generates for each word a number of intermediate sequences 41 by combining mutually different digital words with the data word 19. The intermediate sequences 41 can be generated augmentor 40 simply by placing the digital words in front, middle, or rear of the data word 19.

The generator 20 further comprises a scrambler 42 that scrambles the intermediate sequences 41, one after each other, in order to form a selection set of alternative sequences 21. The inclusion of the mutually different digital words in the intermediate sequences 41 has the effect that the scrambler 42, which is preferably a self-synchronized scrambler, is initialized for each intermediate sequence 41 with a different digital word. Hence, the alternative sequences 21 are relatively good randomizations of the data word 19.

Preferably the augmentor is embodied so as to generate for each data word 19, $2^r$ intermediate sequences 41 by combining all possible digital words of length r with the data word 19. In this way a optimally randomized selection set of alternative sequences 21 is obtained.

Figure 3:
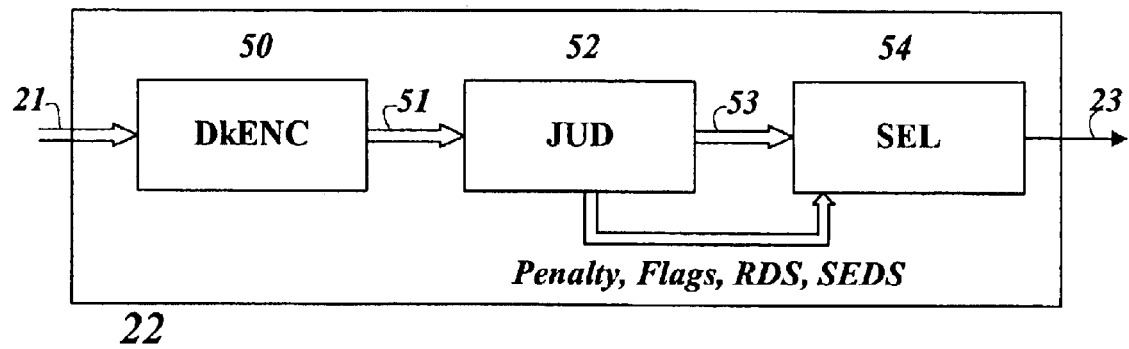
FIG. 3 shows a block diagram of a selector for use in a coding system according to the present invention.

FIG. 3 shows a detailed block diagram of the selector 22. The selector 22 comprises a (d,k) encoder 50, which translates each alternative sequence 21 into a (d,k) constrained sequence 51. To that end, the alternative sequence 21 is partitioned into q m-bit words, where q is an integer. Under the rules of (d,k) encoder 50, the q m-bit words are translated into q n-bit words, wherein n>m. The (d,k) encoder 50 can be of a standard type with parameters m=2, n=3, d=1, k=7, or alternatively m=1, n=2, d=2, k=7.

Preferably, in order to achieve a high coding efficiency, the encoder 50 has parameters of m=9, n=13, and d=1. Reference is made in this respect to the not published PCT application No. PCT/KR00/01292. The encoder 50 may also has parameters of m=6, n=11, and d=2. Reference is made in this respect to the not published PCT application No. PCT/KR01/00359.

The selector 22 further comprises means 52 that determine for each alternative (d,k) constrained sequence 51, if the sequence 51 contains an undesired subsequence such as the sync pattern, a long string of "0"s, or a long string of alternative Tmin runs. If such an undesired subsequence is observed, then a judgment circuit will compute the penalty to be associated with that undesired subsequence.

Means 52 also judges each alternative (d,k) constrained sequence 51 on the number of occurrences of an undesired subsequence such as the sync pattern, or a long string of "0"s, or a long string of alternative Tmin runs, and the contribution of the alternative sequence 21 to the low-frequency components.

Under the rules of the penalty algorithm, the judging means 52 gives a low penalty for desired and a high penalty for undesired sequences or excludes the undesired ones from sequence candidates. The selector 22 also comprises means 54 which selects the alternative (d,k) constrained sequence 51 with the lowest penalty from the sequence candidates.

Figure 4:
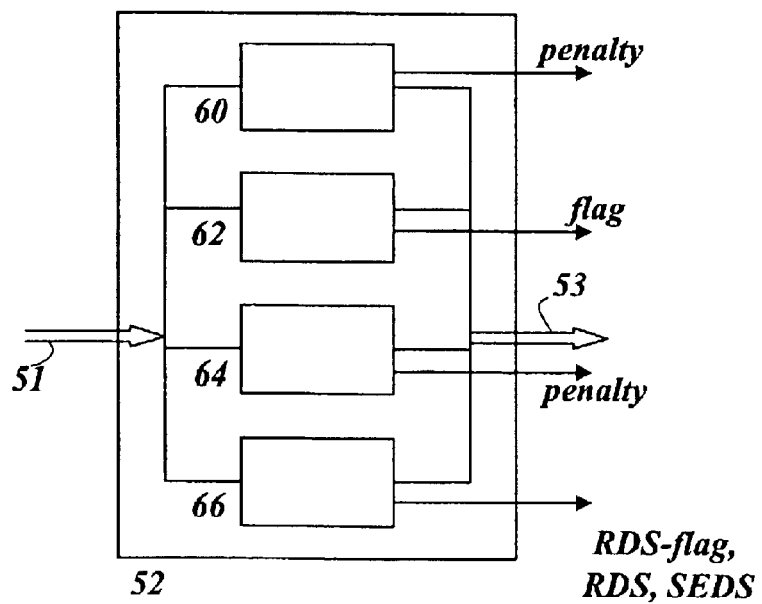
FIG. 4 is a diagram that illustrates the general method for judging the alternative sequences.

FIG. 4 is a diagram that illustrates the general method used in accordance with the present invention to judge and select the alternative (d,k) constrained sequence 51 with the lowest penalty. As depicted in FIG. 4 the judging means 52 comprises a number of metric calculators, which measure in parallel the "0" runlength 60, the occurrence of a prescribed sync pattern 62, the alternate Tmin runlength 64, and the low-frequency component 66, respectively.

The "0" runlength metric is used as a measure of consecutive "0"s (commonly referred to as a "0" runlength) detected within an alternative (d,k) constrained sequence 51. As discussed briefly above, when a "0" run persists within the sequence for an extended period, the recorded features such as pits and lands can become prohibitively long, which can be deleterious such that mistracking and errors are more likely to occur.

The metric calculator 64 measures the number of consecutive Tmin (if d=1, Tmin is "01", if d=2, Tmin is "001") runlength in order to reduce selection probability of a sequence having much repetitive Tmin's violating a MTR (Maximum Transition Run) constraint, for example, a sequence of "01010101 . . . " or "001001001001 . . . ". The metric calculator 64 gives a high penalty for such sequences, which will be then excluded from selectable alternative sequences by selection means 54.

The sync detector 62 detects if prescribed sync pattern occur in an alternative (d,k) constrained sequence 51. If, indeed, such a sync pattern is detected, the sync detector 62 flags that (d,k) constrained sequence. Otherwise, the sequence remains unflagged.

The low-frequency component (LFC) calculator 66 measures the DSV of the alternative (d,k) constrained sequences 51 while modulating sequences using a precoding device. The length of the alternative (d,k) constrained sequence may be long, therefore, the LFC calculator 66 calculates running digital sum (RDS) as well as sequence-end digital sum (SEDS) of each sequence.

Figure 5:
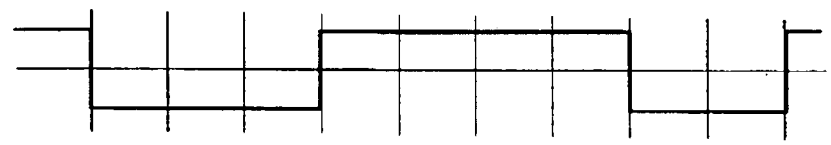
FIG. 5 illustrates an RDS (Running Digital Sum) calculated every bit for a 9-bit sequence.
Figure 5:
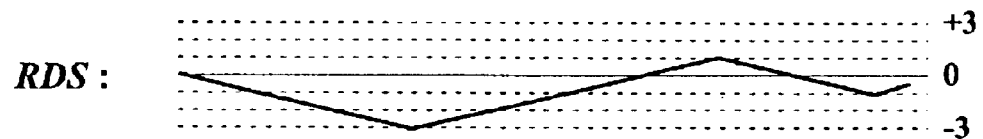

The RDS, which is different from the SEDS, is a digital sum calculated every bit of a sequence. FIG. 5 illustrates an RDS for a 9-bit sequence. In the example of FIG. 5, the SEDS, which is calculated at end of bits, namely, 9-th bit, is '−1', however, the RDS ranges from '−3' to '+1'.

The example of FIG. 5 shows that if the sequence is long it is quite probable for the RDS to be over reasonable limit even though the SEDS have an allowable value. A sequence with a not-allowable RDS causes poor suppression of a DC component.

Because of a reason such as this, the LFC calculator 66 calculates RDS as well as SEDS for each alternative (d,k) constrained sequence. If RDS of a sequence exceeds predetermined thresholds (±Th) during RDS calculation, the LFC calculator 66 sets an RDS overflow flag for the sequence. Otherwise, it sends absolute values of maximum RDS and SEDS, namely, |RDS|max and |SEDS| to the selection means 54. The thresholds (±Th) are chosen to obtain the best DC control performance through trial and error experiments.

The various metrics, the sync detector, and the RDS overflow flag are inputs of the selection means 54 together with (d,k) constrained sequences 51. The selection means 54 finally takes a decision based on weights associated with the various input metrics related with the alternative sequences to select one to be recorded or transmitted. In this decision, alternative (d,k) constrained sequences with set flag are excluded.

After exclusion, the selection means 54 checks whether there are remaining alternative (d,k) constrained sequences. If there are, the selection means 54 selects one (d,k) constrained sequence with the smallest |RDS| max for recording onto a recordable medium. If there are at least two sequences with the same smallest |RDS| max, a sequence with the lowest penalty, which is assigned by the metric calculators 60 and 64 based on alternative Tmin runlength and "0" runlength, may be selected among them for recording onto a recordable medium. As a different selection manner, if there are at least two sequences with the same smallest |RDS| max, a sequence with smaller RDS at bit end, namely, smaller SEDS can be selected among them.

Figure 6:
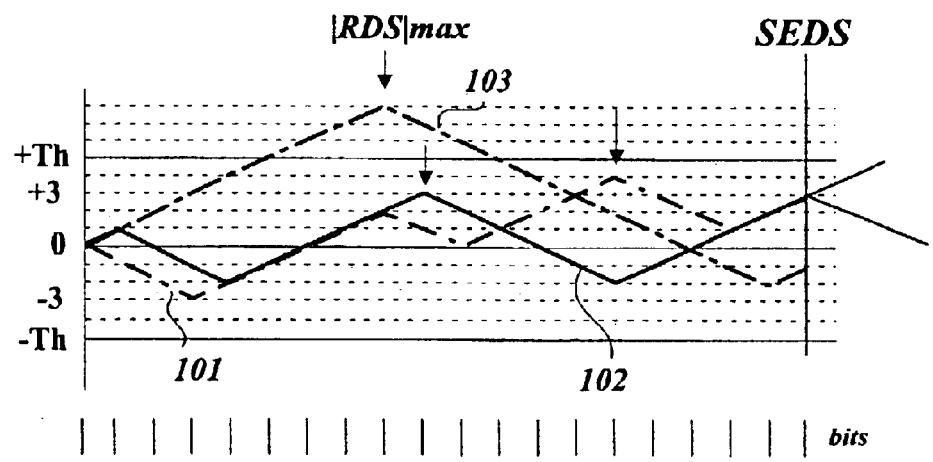
FIG. 6 shows an illustrative case that one sequence is chosen based on the RDS among several alternative (d,k) constrained sequences.

FIG. 6 shows an illustrative case that one sequence is chosen among several alternative (d,k) constrained sequences. FIG. 6 is shown for illustration only under condition that a sequence is 19-bits long.

In the case of FIG. 6, a sequence 103 has a SEDS of '−1' which is smaller, in absolute sense, than '+3' of sequences 101 and 102. However, an RDS of the sequence 103 has '+7' beyond the threshold '5' within bits, so that this sequence 103 is excluded from selectable candidates. Because |RDS| max, 3 of the sequence 102 is smaller than 4 of the sequence 101, the sequence 102 is selected for recording onto a recordable medium.

According to selection of the sequence 102, digital sum value to be calculated for next alternative (d,k) constrained sequence set begins with '+3' which is SEDS of the selected sequence 102.

As another different sequence selecting manner, a sequence with the smallest maximum value of |RDS| is not necessarily selected. Instead, adequate weighting factors are given to respective penalties assigned from |RDS| max, alternative Tmin runlength, and "0" runlength, and a sequence with the lowest penalty sum each component of which is weighted by a corresponding factor, can be selected for recording onto a recordable medium.

If there is no remaining sequence after exclusion of flagged sequences, the selection means 54 selects a sequence with the smallest |SEDS| for recording onto a recordable medium among the alternative (d,k) constrained sequences with RDS overflow flag set.

Figure 7:
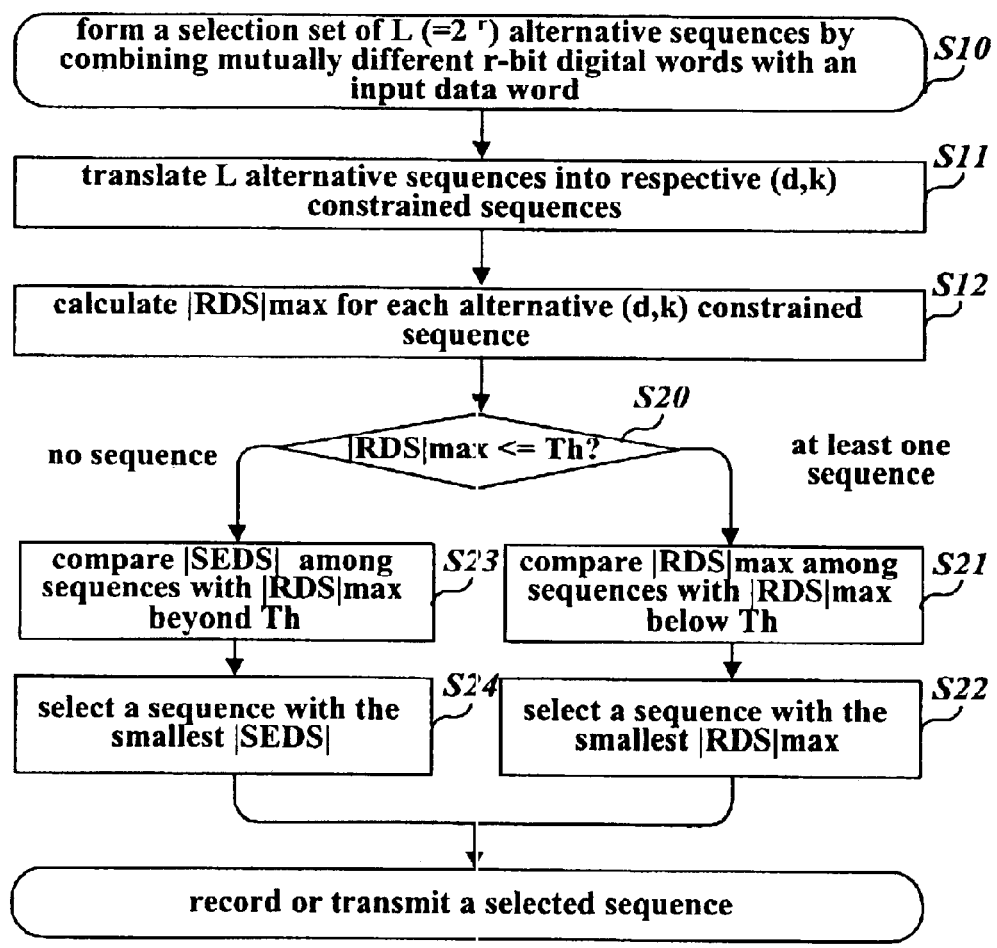
FIG. 7 is a procedure selecting a sequence advantageous to DSV control in a data modulating process in accordance with the present invention.

FIG. 7 is a procedure depicting a DSV control according to the above-explained manner. The step S10 is conducted by the generator 20 which forms a selection set of L(=$2^r$) alternative sequences 21 by combining mutually different r-bit digital words with an input data word and scrambling them. The step S11 is conducted by the (d,k) encoder 50, and the step S12 is conducted by the LFC calculator 66 which calculates RDS, and SEDS for each alternative (d,k) constrained sequence.

The step S20, in which it is checked whether there is any sequence of which |RDS| is within the thresholds ±Th, is included in the operation of the selection means 54 that selects a sequence for recording among remaining ones after excluding flagged sequences. The next steps S21 and S22, in which a sequence with the smallest |RDS| max is selected among the remaining sequences, and steps S23 and S24, in which a sequence with the smallest |SEDS| is selected if there is no remaining sequence, were explained in detail before.

In the above-explained embodiments of the present invention, a sync pattern consisting of at least two "0" runs shorter than k is used. As a result, coding efficiency will benefit from such a relatively short sync pattern.

The alternative (d,k) constrained sequence 51 that has been selected by selector 54 is converted into a modulated signal using the NRZI pre-coding procedure. Then, the modulated signal is generated by the selected (d,k) constrained sequence 51 integrated modulo-2 in which a '1' becomes a transition and a '0' becomes an absence of a transition and forwarded to the recording medium.

The invention may be embodied in other specific forms without departing from the sprit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of converting a series of data words into a modulated signal, comprising the steps of:
   (a) generating for each data word a number of alternative sequences by combining mutually different digital words with the data word;
   (b) translating each alternative sequence into a (d,k) constrained sequence according to a predefined coding rate m/n;
   (c) checking development of digital sum every bit for each translated (d,k) constrained sequence to detect a maximum value in the development of digital sum; and
   (d) sorting out the translated (d,k) constrained sequences based on whether the maximum value of each sequence exceeds a preset threshold, and selecting one (d,k) constrained sequence for recording onto a recordable medium.

2. The method of claim 1, wherein the maximum value detected in said step (c) is the largest value in an absolute sense.

3. The method of claim 1, wherein said step (d) selects one (d,k) constrained sequence with the smallest maximum value in the development of digital sum among the sorted-out sequences.

4. The method of claim 3, wherein, if there are at least two sequences of which a maximum value in the development of digital sum is smallest, said step (d) selects one (d,k) constrained sequence for recording, based on a number of undesirable subsequences each (d,k) constrained sequence includes.

5. The method of claim 4, wherein the undesirable subsequences include consecutive long "0"s and/or repetitive Tmin where Tmin is the shortest allowable consecutive "0"s under a given d.

6. The method of claim 3, wherein, if there are at least two sequences of which a maximum value in the development of a digital sum is smallest, said step (d) selects for recording one (d,k) constrained sequence of which development of a digital sum is smaller at bit end than others.

7. The method of claim 1, wherein, if there is no sequence of which development of a digital sum does not exceed the preset threshold, said step (d) selects one (d,k) constrained sequence, of which a digital sum at bit end is smallest, among the translated (d,k) constrained sequences.

8. The method of claim 1, wherein said step (a) further scrambles each combination of a digital word and the data word to form the alternative sequences.

9. An apparatus of converting a series of data words into a modulated signal, comprising:
   a generator generating for each data word a number of alternative sequences by combining mutually different digital words with the data word;
   an encoder translating each alternative sequence into a (d,k) constrained sequence according to a predefined coding rate m/n;
   a judging means checking development of a digital sum every bit for each translated (d,k) constrained sequence to detect a maximum value in the development of digital sum and a digital sum at bit end; and
   a selecting means checking whether there is at least one (d,k) constrained sequence of which a maximum value in the development of a digital sum is below a preset threshold, and selecting one (d,k) constrained sequence among the translated (d,k) constrained sequences for recording onto a recordable medium based on the detected maximum value if there is, or based on the detected digital sum at bit end if there is not.

10. The apparatus of claim 9, wherein the maximum value detected by said judging means is the largest value in an absolute sense.

11. The apparatus of claim 9, wherein said selecting means sorts out the translated (d,k) constrained sequences of which the maximum value is not beyond the preset threshold, and selects one (d,k) constrained sequence with the smallest maximum value for recording onto a recordable medium among the sorted-out sequences.

12. The apparatus of claim 11, wherein said judging means assigns a penalty to each (d,k) constrained sequence in proportion to a runlength of consecutive "0"s and a runlength of consecutive "Tmin"s included in the sequence where Tmin is the shortest allowable consecutive "0"s under a given d.

13. The apparatus of claim 12, wherein, if there are at least two sequences of which a maximum value in the development of a digital sum is smallest, said selecting means selects one (d,k) constrained sequence for recording based on each penalty assigned to each sequence by said judging means.

14. The apparatus of claim 11, wherein if there are at least two sequences of which a maximum value in the development of a digital sum is smallest, said selecting means selects for recording one (d,k) constrained sequence of which the digital sum at bit end is smaller than others.

15. The apparatus of claim 9, wherein, if there is no sequence of which development of a digital sum does not exceed the preset threshold, said selecting means selects one (d,k) constrained sequence, of which a digital sum at bit end is smallest, among the translated (d,k) constrained sequences.

16. The apparatus of claim 9, wherein said judging means further checks whether each (d,k) constrained sequence includes a sync pattern, and wherein said selecting means checks whether there is at least one (d,k) constrained sequence of which development in a digital sum never exceeds the preset threshold after excluding sequences with a sync pattern from the translated (d,k) constrained sequences.

17. The apparatus of claim 9, wherein said generator further scrambles each combination of a digital word and the data word to form the alternative sequences.

* * * * *